(12) United States Patent
Mimura

(10) Patent No.: US 10,157,761 B2
(45) Date of Patent: Dec. 18, 2018

(54) TEMPERATURE CONTROLLER OF SEMICONDUCTOR WAFER

(71) Applicant: KELK Ltd., Hiratsuka-shi, Kanagawa (JP)

(72) Inventor: Kazuhiro Mimura, Hiratsuka (JP)

(73) Assignee: KELK Ltd., Hiratsuka-shi, Kanagawa (JP)

(*) Notice: Subject to any disclaimer, the term of this patent is extended or adjusted under 35 U.S.C. 154(b) by 49 days.

(21) Appl. No.: 15/239,062

(22) Filed: Aug. 17, 2016

(65) Prior Publication Data

US 2018/0053668 A1 Feb. 22, 2018

(51) Int. Cl.
*G06F 19/00* (2018.01)
*H01L 21/67* (2006.01)
*G05D 23/19* (2006.01)

(52) U.S. Cl.
CPC ... *H01L 21/67248* (2013.01); *G05D 23/1917* (2013.01); *H01L 21/67109* (2013.01)

(58) Field of Classification Search
CPC .......... G05D 23/1917; H01L 21/67248; H01L 21/67109
USPC ......................................................... 700/300
See application file for complete search history.

(56) References Cited

U.S. PATENT DOCUMENTS

| | | | | |
|---|---|---|---|---|
| 4,416,324 A | * | 11/1983 | Sutoh | ................. B60H 1/00978 165/202 |
| 6,207,936 B1 | * | 3/2001 | de Waard | ............. G05B 13/027 219/412 |
| 2009/0105867 A1 | * | 4/2009 | Yamaguchi | ............. C23C 16/46 700/121 |
| 2011/0066294 A1 | | 3/2011 | Takechi et al. | |
| 2014/0073043 A1 | * | 3/2014 | Holmes | .................. G01N 35/00 435/287.3 |
| 2015/0212528 A1 | * | 7/2015 | Mimura | ............ H01L 21/67248 700/300 |

FOREIGN PATENT DOCUMENTS

| | | |
|---|---|---|
| JP | H07-200076 | 8/1995 |
| JP | 2000-193375 | 7/2000 |
| JP | 2009301258 A | * 12/2009 |
| JP | 2015-141443 | 8/2013 |
| WO | WO 2010/053173 | 5/2010 |

OTHER PUBLICATIONS

Japan Office Action in Japan Application No. 2014-103322, dated Dec. 19, 2017, 3 pages. (with English translation).

* cited by examiner

*Primary Examiner* — Michael D Masinick
(74) *Attorney, Agent, or Firm* — Fish & Richardson P.C.

(57) ABSTRACT

A temperature controller for a semiconductor wafer is configured to perform a temperature control on a plurality of temperature adjusters including a reference temperature adjuster to perform a temperature adjustment of the semiconductor wafer, in which a manipulated variable calculator to give a manipulated variable to a master loop and a slave loop includes a master-slave switching unit configured to switch between the master loop and the slave loop and a master-slave cancellation unit configured to cancel a setting of the master loop and the slave loop when a temperature setpoint of the slave loop is set to have a temperature gradient against a temperature setpoint of the master loop.

4 Claims, 12 Drawing Sheets

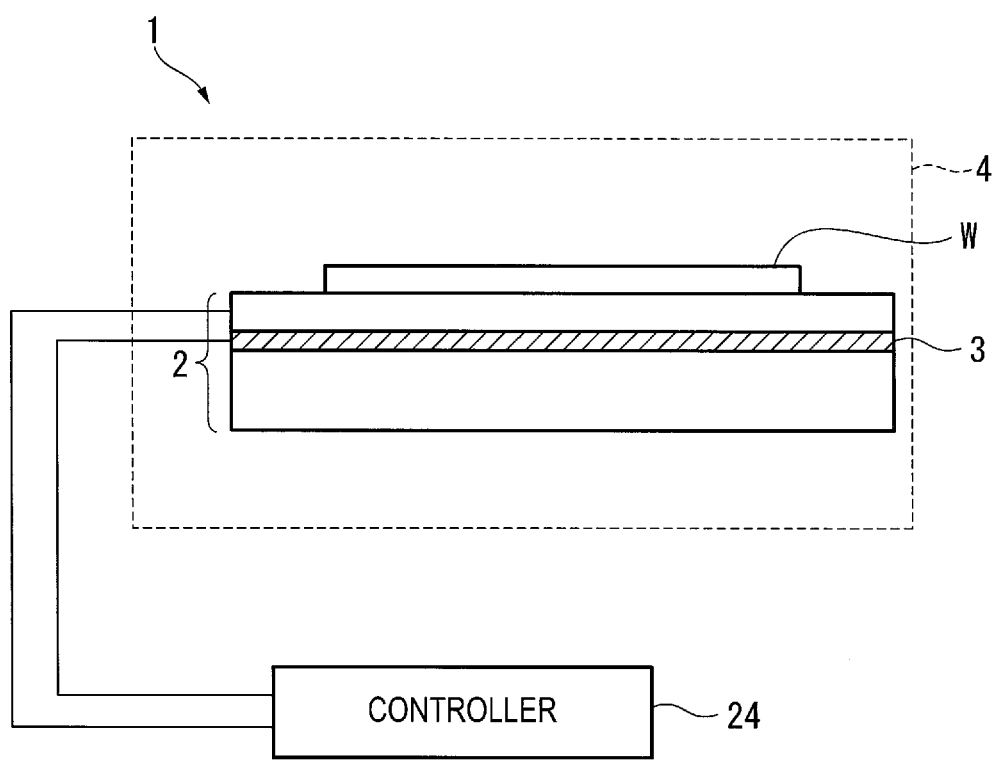

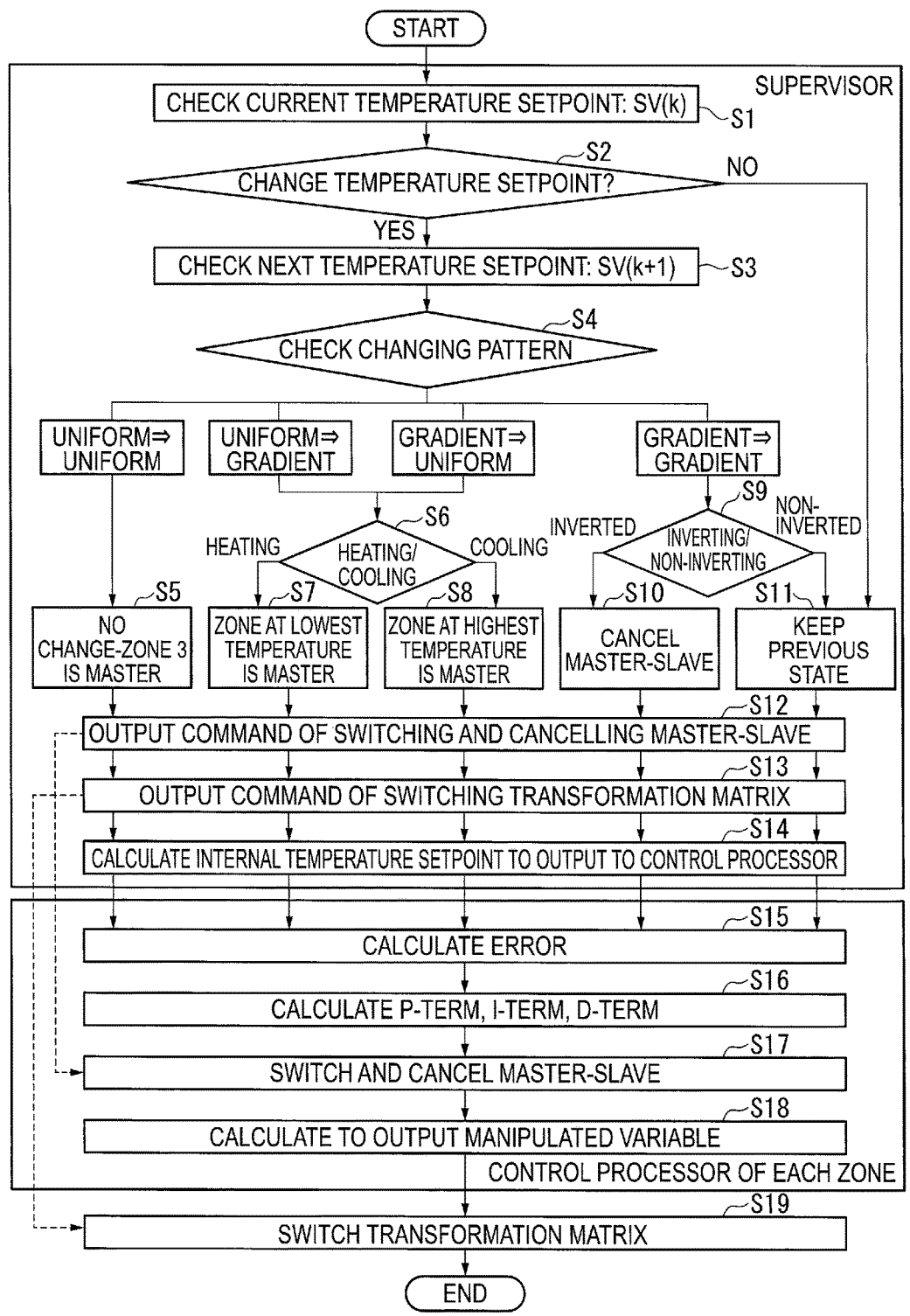

TEMPERATURE CONTROLLER OF SEMICONDUCTOR WAFER

TECHNICAL FIELD

The present invention relates to a temperature control device for a semiconductor wafer, the temperature control device being configured to perform a temperature control of a plurality of temperature adjusters to perform a temperature adjustment of the semiconductor wafer.

BACKGROUND ART

A process for treating a semiconductor wafer such as a silicon wafer includes controlling an in-plane temperature distribution of the silicon wafer as desired while controlling the temperature of the silicon wafer to a temperature setpoint.

For this purpose, there has been known a method of controlling the temperature of the semiconductor wafer simultaneously using a plurality of temperature adjusters through independent control loops respectively provided to the temperature adjusters.

Regarding the above temperature control for a semiconductor wafer, it is necessary that control variables should have a certain error from a reference control variable until the temperature reaches a setpoint and that the temperature should be maintained at the setpoint irrespective of any disturbance. In connection with the above, a master-slave control method is typically known (see, for instance, Patent Literature 1: JP-A-7-200076).

In the master-slave control method, one of a plurality of control loops is controlled as a master, and an error between a control variable (a setpoint) of the master loop and a control variable of the rest (a slave loop(s)) of the control loops is calculated and controlled so that the slave loop(s) follows the behavior of the master loop.

Usually, the control loop having the slowest response speed is defined as the master loop and the rest of the control loops is defined as the slave loop following the master loop.

When the master-slave control method is applied to a plate-shaped temperature adjustment device for a semiconductor which includes a plurality of heating and cooling zones, temperatures of all the zones are made uniform, or alternatively, the plate is made to have temperature gradient with different temperature setpoints for the zones, depending on usage. For instance, when the plate is placed in a chamber, the semiconductor wafer is liable to be affected by heat of walls of the chamber, so that a periphery of the plate may be easily heated than the center thereof.

In such a case, a temperature setpoint of a central zone of the plate needs to be set high while a temperature setpoint of a peripheral zone of the plate needs to be set low. For this setting, an offset temperature, which is suitable for a temperature adjuster in the slave loop relative to a temperature setpoint of a temperature adjuster in the master loop, is set for adjustment.

However, although described in more detail later, in the master-slave control method, heating and cooling in the plate with a temperature gradient cause problems below.

Specifically, when a control loop having the highest temperature setpoint is set as the master loop in the heating, the slave loop is set to have a temperature setpoint that includes a certain offset against the temperature setpoint of the master loop. Accordingly, when the master loop starts to be executed for heating, the slave loop temporarily starts being executed for cooling against the master loop so as to provide a certain offset.

Moreover, for instance, when the temperatures of three zones are stabilized in a steady state at the respective temperature setpoints (SV1, SV2, SV3)=(10° C., 20° C., 30° C.) and, subsequently, the temperature setpoints are inverted to (SV1, SV2, SV3)=(30° C., 20° C., 10° C.), the temperature in the middle zone deviates from the temperature setpoint SV2 at the moment of switching between the temperature setpoints although the temperature setpoint SV2 is supposed to be unchanged. Such an error requires more time for stabilizing the temperature to the temperature setpoint, which adversely affects throughput.

SUMMARY OF THE INVENTION

An object of the invention is to provide a temperature control device for a semiconductor wafer, in which the temperature control device employs a master-slave control method and is capable of improving throughput.

In a first aspect of the invention, a temperature controller for a semiconductor wafer is configured to perform a temperature control of a plurality of temperature adjusters including a reference temperature adjuster to perform a temperature adjustment of the semiconductor wafer, and includes: a master loop configured to perform a temperature control of the reference temperature adjuster; a slave loop configured to perform a temperature control of the temperature adjuster(s) other than the reference temperature adjuster to follow the master loop; a master temperature detector configured to detect a temperature of the semiconductor wafer subjected to the temperature adjustment by the reference temperature adjuster of the master loop; a slave temperature detector configured to detect the temperature of the semiconductor wafer subjected to the temperature adjustment by the temperature adjuster(s) of the slave loop; and a manipulated variable calculator configured to calculate a manipulated variable to be given to the reference temperature adjuster of the master loop and a manipulated variable to be given to the temperature adjuster(s) of the slave loop, based on the temperature detected by the master temperature detector and the temperature detected by the slave temperature detector, in which the manipulated variable calculator includes: a master-slave switching unit configured to switch between the master loop and the slave loop according to setting conditions of a temperature setpoint of the master loop and a temperature setpoint of the slave loop before and after being changed; and a master-slave cancellation unit configured to cancel a setting of the master loop and the slave loop.

In a second aspect of the invention, the master-slave switching unit is configured to switch the master loop to a loop having a lowest temperature setpoint in a heating control and to a loop having a highest temperature setpoint in a cooling control.

In a third aspect of the invention, the slave loop comprises two or more slave loops, and the temperature gradient in three or more levels is set between the master loop and the two slave loops, and the master-slave cancellation unit cancels the setting of the master loop when the temperature gradient set in the three or more levels is inverted during the temperature control.

According to the first aspect of the invention, since the master-slave switching unit and the master-slave cancellation unit are provided, the master-slave relationship can be switched or the setting of the master-slave relationship can be cancelled by providing a constant temperature or a temperature gradient among the master loop and slave loops, it is preventable that the slave loops demonstrate a response in a temperature-lowering direction as the temperature of the temperature adjuster of the master loop starts increasing at the start of the temperature control, or the slave loops demonstrate a response in a temperature-increasing direction as the temperature of the temperature adjuster of the master loop starts decreasing, and throughput of the temperature control device is improvable.

According to the second aspect of the invention, since the master-slave switching unit is provided, since the loop having the lowest temperature setpoint is switched to the master loop in the heating control and the loop having a highest temperature setpoint is switched to the master loop in the cooling control, the slave loop(s) does not demonstrate a setpoint response in an inverse direction at the start of the control, so that the throughput of the temperature control device is reliably improvable.

According to the third aspect of the invention, since the master-slave cancellation unit cancels the master-slave relationship, even when the temperature gradient set in three or more levels is inverted, a deviation is unexpected in the setpoint response of the loop having an intermediate temperature setpoint set between the highest temperature setpoint and the lowest temperature setpoint.

BRIEF DESCRIPTION OF DRAWING(S)

FIG. 1 is a block diagram showing a temperature adjustment device according to an exemplary embodiment of the invention.

FIG. 5 is a flow chart for explaining the effects of the first exemplary embodiment.

DESCRIPTION OF EMBODIMENT(S)

Exemplary embodiment(s) of the invention will be described below with reference to the attached drawings.

1. Structure of Temperature Adjustment Device 1

FIG. 1 shows a temperature adjustment device 1 according to a first exemplary embodiment of the invention. The temperature adjustment device 1 controls a temperature of a silicon wafer W placed on a plate-shaped stage 2 to a temperature setpoint to control an in-plane temperature distribution of the silicon wafer W. The temperature adjustment device 1 is used, for instance, in a dry process.

The temperature adjustment device 1 includes the plate-shaped stage 2 and a temperature adjuster 3. The temperature adjuster 3 is preferably provided in a form of a chiller device or a thermoelectric element when used for heating and cooling control. When used only for heating control, the temperature adjuster 3 can be in a form of a heater.

The stage 2 is disposed in a vacuum chamber 4. The silicon wafer W is placed on the stage 2. The silicon wafer W is electrostatically held on the stage 2. It should be noted that helium gas may be delivered between the stage 2 and the silicon wafer W to enhance efficiency in heat transfer between the stage 2 and the silicon wafer W.

In the dry process, the vacuum chamber 4 is air-purged to be kept at a predetermined low pressure state.

Figure 2A:
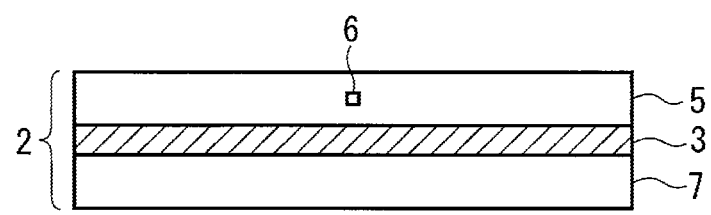
FIG. 2A is a cross-sectional view showing an arrangement of a temperature adjuster and a temperature sensor in the exemplary embodiment.
Figure 2B:
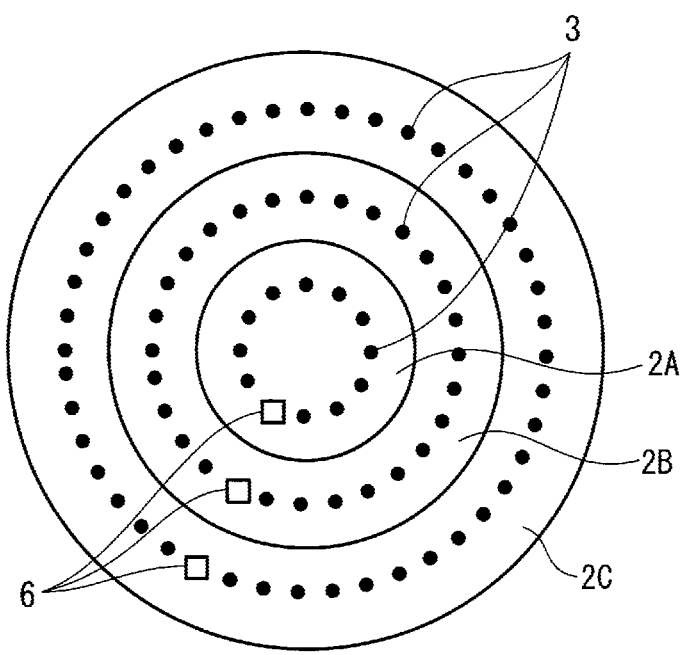
FIG. 2B is a plan view showing the arrangement of the temperature adjuster and the temperature sensor in the exemplary embodiment.

In the stage 2, a plurality of temperature adjusters 3 are disposed as shown in FIGS. 2A and 2B so as to adjust the in-plane temperature distribution of the silicon wafer W placed on the stage 2.

FIG. 2A is a cross-sectional view of the stage 2. The temperature adjusters 3 are disposed on a base plate 7. A plate 5 is placed on the temperature adjusters 3. A temperature sensor 6 (a temperature detector) is disposed in the plate 5.

FIG. 2B is a plan view of the stage 2, showing that the stage 2 is divided into three concentric zones 2A, 2B, 2C, in each of which the temperature adjusters 3 are disposed. The temperature sensors 6 in the plate 5 are disposed at positions corresponding to the temperature adjusters 3.

The zones 2A, 2B and 2C of the stage 2 can be independently heated by electrifying the temperature adjusters 3. Accordingly, by adjusting electrification to each of the temperature adjusters 3 to control the temperature adjusters 3, the in-plane temperature distribution of the silicon wafer W on the stage 2 is adjustable. The temperature adjusters 3 in each of the zones 2A, 2B and 2C are controlled by a controller 24.

2. Structure of Controller 24

Figure 3:
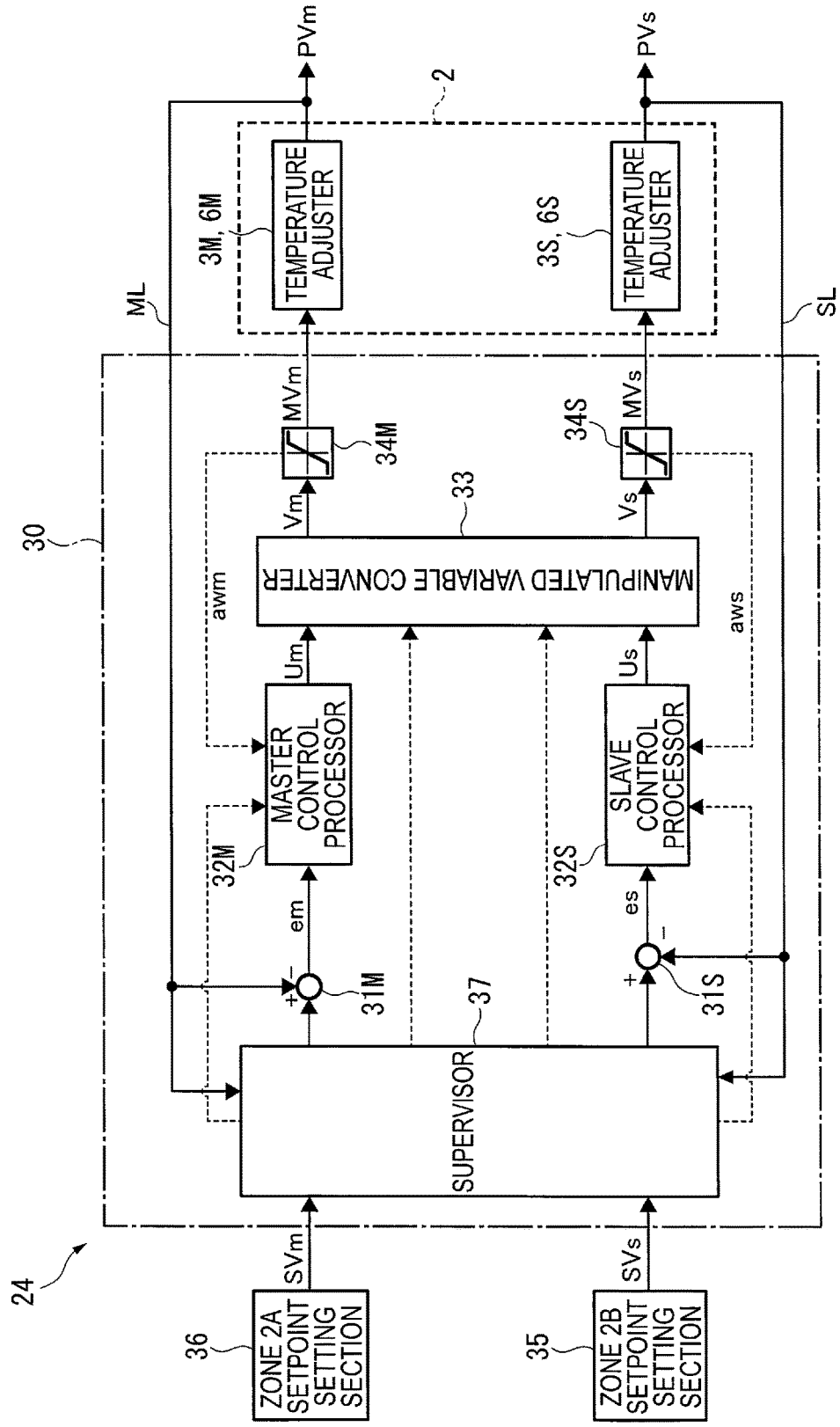
FIG. 3 is a block diagram showing a configuration of a controller that controls the temperature adjustment device according to the first exemplary embodiment.

The controller 24 controls the temperature adjusters 3, which include master temperature adjusters 3M and slave temperature adjusters 3S, based on temperatures detected by the temperature sensor 6 as described above, and has a functional configuration as shown in a block diagram of FIG. 3.

The controller 24 includes: a master loop ML for controlling temperature adjusters 3M configured to heat the zone 2A shown in FIGS. 2A and 2B; a slave loop SL for controlling temperature adjusters 3S configured to heat the zones 2B and 2C; a master temperature sensor 6M configured to detect the temperature of each of the temperature adjusters 3M; a slave temperature sensor 6S configured to detect the temperature of each of the temperature adjusters 3S; and a manipulated variable calculator 30 that calculates a manipulated variable for each of the master loop ML and the slave loop SL. It should be noted that the slave loop SL includes two loops for the zones 2B, 2C that similarly follow the master loop ML, and thus only one of the loops is shown in FIG. 3.

In a master-slave control system, a control variable for a slave side follows a control variable for a master side to control the temperature distribution. Accordingly, when the temperatures of the zones 2A, 2B and 2C are uniformly controlled relative to the same temperature setpoint, since the maximum response speed of the control system is usually limited by a loop with the slowest response speed, the loop with the slowest response speed should be defined as the master loop ML.

The manipulated variable calculator 30 applies manipulated variables MVm, MVs based on a master control setpoint SVm and a slave control setpoint SVs to the temperature adjusters 3M, 3S, respectively.

The manipulated variable calculator 30 includes a master error calculator 31M, a slave error calculator 31S, a master control processor 32M, a slave control processor 32S, a manipulated variable converter 33, a master manipulated variable regulator 34M, a slave manipulated variable regulator 34S, a setpoint setting section 35 for the zone 2B, a setpoint setting section 36 for the zone 2A, and a supervisor 37 serving as a master-slave cancellation unit, a master-slave switching unit and an internal temperature setpoint calculator. Herein, the internal temperature setpoint refers to a temperature setpoint for master-slave control which is calculated by the supervisor 37 using the temperature setpoints of the zones set by the setpoint setting sections. When the master-slave relationship is cancelled, the temperature setpoint is equal to the internal temperature setpoint.

The master error calculator 31M and the slave error calculator 31S respectively calculate a master loop error em and a slave loop error es with use of the internal temperature setpoint calculated by the supervisor 37 and temperature sensor detection values PVm and PVs of the zones.

The master control processor 32M, an example of which is a PID controller, outputs a calculation result Um to the manipulated variable converter 33.

The slave control processor 32S similarly outputs a calculation result Us to the manipulated variable converter 33.

The manipulated variable converter 33 is configured to convert the inputted calculation result Um from the master control processor 32M and calculation result Us from the slave control processor 32S into manipulated variables so that interaction between the master loop ML and the slave loop SL is reduced. The two inputs Um, Us are converted into the two outputs Vm, Vs using a transformation matrix H and the thus-obtained master manipulated variables Vm and slave manipulated variable Vs are outputted. The transformation matrix H is obtained from, for instance, a steady-state gain matrix Gp=P(0) and a master-slave manipulated variable transformation matrix Gm, given that a target to be controlled is represented by a transfer function matrix P(s). The transformation matrix H for obtaining the manipulated variables is represented by the following formula (1), given that the transfer function matrix P(s) has two rows and two columns.

$$\begin{bmatrix} V_m \\ V_s \end{bmatrix} = H \cdot \begin{bmatrix} U_m \\ U_s \end{bmatrix} = \begin{bmatrix} h_{11} & h_{12} \\ h_{21} & h_{22} \end{bmatrix} \begin{bmatrix} U_m \\ U_s \end{bmatrix} \quad (1)$$

$$H = (Gm \cdot Gp)^{-1}$$

$$Gp = P(0)$$

The master manipulated variable regulator 34M regulates the manipulated variable so that the output of the temperature adjusters 3M falls within a range from the minimum output to the maximum output thereof. When determining that the manipulated variable reaches a saturation level, the master manipulated variable regulator 34M outputs a corresponding determination signal awm to the master control processor 32M. The output of the master manipulated variable regulator 34M is outputted as the manipulated variable MVm to the temperature adjusters 3M.

Similarly, the slave manipulated variable regulator 34S regulates the manipulated variable so that the output of the temperature adjusters 3S falls within a range from the minimum output to the maximum output thereof. When determining that the manipulated variable reaches a saturation level, the slave manipulated variable regulator 34S outputs a corresponding determination signal aws to the slave control processor 32S. The output of the slave manipulated variable regulator 34S is outputted as the manipulated variable MVs to the temperature adjusters 3S. The determination signals awm, aws function as anti-windup activation signals in the master control processor 32M and the slave control processor 32S, respectively.

Based on information of the current temperature setpoint, the changed temperature setpoint, and the current temperatures of the zones, the supervisor 37 is configured: to output the internal temperature setpoint, which has been changed according to a changing pattern, to the error calculators 31M, 31S of the zones; to determine and output a command for switching between the master loop and the slave loop and cancelling the relationship between the master loop and the slave loop; and to determine and output a command for switching the transformation matrix in the manipulated variable converter 33.

As shown in a flowchart described below, the supervisor 37 finishes switching between the master loop and the slave loop and cancelling the relationship between the master loop and the slave loop, and switching the transformation matrix, before outputting the internal temperature setpoint to the error calculators 31M, 31S. The control processors 32M, 32S, which perform a typical output calculation based on the errors calculated by the error calculators 31M, 31S, add a processing of bumplessly switching between the master loop and the slave loop and cancelling the relationship between the master loop and the slave loop according to the respective commands.

The supervisor 37 also switches the transformation matrix in the manipulated variable converter 33. The transformation matrix is switched as follows. The transformation matrix indicates a product of a transformation matrix S of states and a decoupling matrix D for reducing interaction of a plant.

$$H = S \times D$$

In other words, the supervisor 37 switches the transformation matrix S. A switching of the transformation matrix S is performed below, for instance, for three zones.

When a zone 1 is a master, the switching of the transformation matrix S is equivalent to adding an output of the zone 1 to an output of each of the other slaves.

$$S_1 = \begin{bmatrix} 1 & 0 & 0 \\ 1 & 1 & 0 \\ 1 & 0 & 1 \end{bmatrix} \quad (2)$$

When a zone 3 is a master, the switching of the transformation matrix S is equivalent to adding an output of the zone 3 to an output of each of the other slaves.

$$S_3 = \begin{bmatrix} 1 & 0 & 1 \\ 0 & 1 & 1 \\ 0 & 0 & 1 \end{bmatrix} \quad (3)$$

When the master-slave relationship is cancelled, the outputs of the zones are each independently processed.

$$S_0 = \begin{bmatrix} 1 & 0 & 0 \\ 0 & 1 & 0 \\ 0 & 0 & 1 \end{bmatrix} \quad (4)$$

The manipulated variable converter 33 switches among these three matrixes in response to the command from the supervisor 37.

Next, a bumpless switching will be described.

Figure 4A:
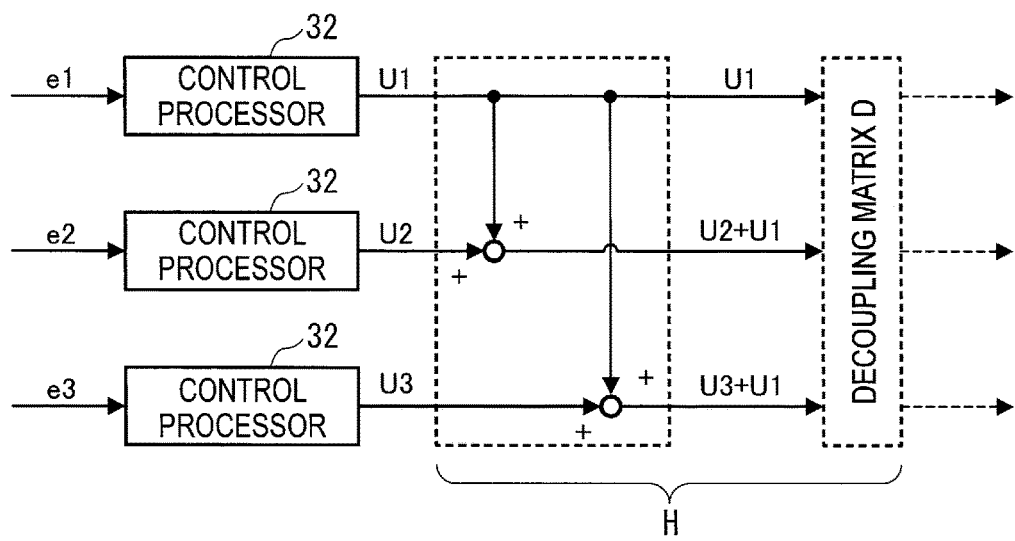
FIG. 4A is a schematic diagram for explaining matrix transformation in a manipulated variable converter in the exemplary embodiment.

In the manipulated variable converter 33 of a three-input three-output system, when the zone 1 is defined as the master, the zones 2 and 3 are defined as the slave output, and outputs of the respective controllers in a steady state before the switching are respectively defined as U1, U2 and U3 as shown in FIG. 4A, the output of the manipulated variable converter 33 is subjected to a state conversion in the transformation matrix H and is subsequently decoupled by the decoupling matrix D. After the state conversion of the outputs U1, U2 and U3 of the manipulated variable converter 33 before the switching, the outputs of the respective zones are as follows.

Zone 1: $U1$

Zone 2: $U2+U1$

Zone 3: $U3+U1$ (5)

Figure 4B:
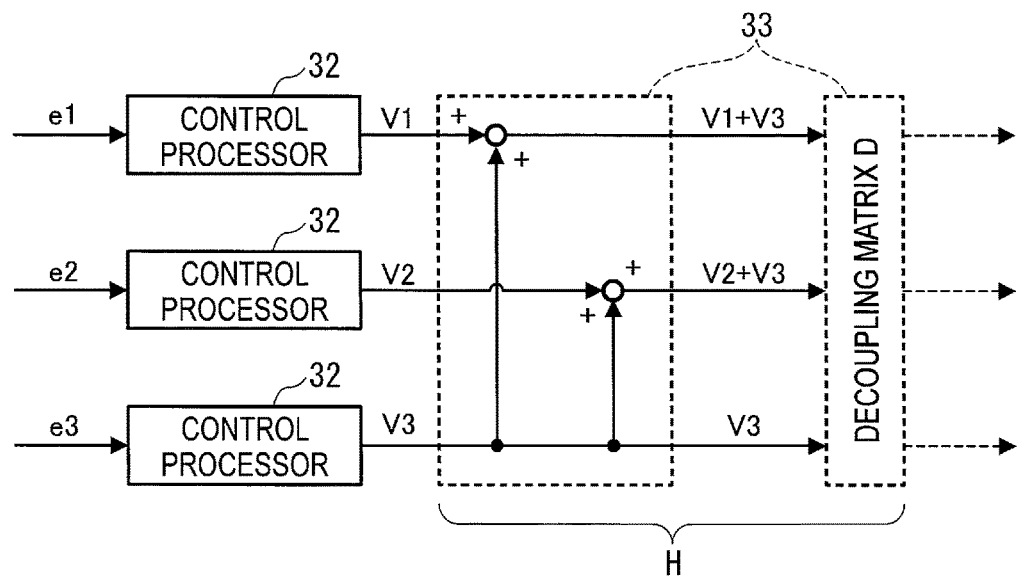
FIG. 4B is another schematic diagram for explaining matrix transformation in a manipulated variable converter in the exemplary embodiment.

When the master loop is switched from the zone 1 to the zone 3 and the outputs at which the manipulated variable converter 33 can keep the steady state even after the switching are defined as V1, V2 and V3 as shown in FIG. 4B, the outputs of the zones after the state conversion are shown below.

Zone 1: $V1+V3$

Zone 2: $V2+V3$

Zone 3: $V3$ (6)

If (5)=(6) before and after the switching, the output is unchanged, so that the zone 3 is shown as follows:

$V3=U3+U1$.

Since the zone 1 is shown as follows based on V1+V3=U1:

$V1=U1-V3=U1-(U3+U1)=-U3$ (7)

Since the zone 2 is shown as follows based on V2+V3=U2+U1:

$V2=U2+U1-V3=U2+U1-(U3+U1)=U2-U3$ (8)

With respect to the other switching, a bumpless switching is achievable by the same idea.

When a zone 2A, a zone 5 2B and a zone 2C in FIG. 2B are respectively defined as the zones 1, 2 and 3, a switching processing of a temperature control system for the three zones, which is executed according to PID algorithm, will be described below. A derivative term is omitted for simplification (PI control).

Explanation of Codes

Codes in the following PID algorithm mean as follows.

MV1k_1, Kp_1, errk_1: a value of a proportional term, a proportional gain, and an error of the zone 1;

MV1k_2, Kp_2, errk_2: a value of a proportional term, a proportional gain, and an error of the zone 2;

MV1k_3, Kp_3, errk_3: a value of a proportional term, a proportional gain, and an error of the zone 3;

MV2k_1, MV3k_1, Ki_1: a value of a current integral term, a value of a previous integral term, and an integral time of the zone 1;

MV2k_2, MV3k_2, Ki_2: a value of a current integral term, a value of a previous integral term, and an integral time of the zone 2;

MV2k_3, MV3k_3, Ki_3: a value of a current integral term, a value of a previous integral term, and an integral time of the zone 3;

istop1, istop2, istop3: anti-windup commands of the respective zones;

buf: buffer (temporary escape);

MVfinal_1: a manipulated variable of the zone 1;

MVfinal_2: a manipulated variable of the zone 2; and

MVfinal_3: a manipulated variable of the zone 3.

<Algorithm>

% P Term Calculation $MV1k\_1=Kp\_1*errk\_1;$ $MV1k\_2=Kp\_2*errk\_2;$ $MV1k\_3=Kp\_3*errk\_3;$ % I Term Calculation $MV2k\_1=MV3k\_1+Kp\_1*Ki\_1*errk\_1;$ $MV2k\_2=MV3k\_2+Kp\_2*Ki\_2*errk\_2;$ $MV2k\_3=MV3k\_3+Kp\_3*Ki\_3*errk\_3;$ % Anti-Wind Up
if(istop_1==1)

$MV2k\_1=MV3k\_1;$ end
if(istop_2==1)

$MV2k\_2=MV3k\_2;$ end
% Manipulated variable output for master-slave switching/cancellation processing if(the master-slave relationship of the zone 3 is cancelled)

$MV2k\_1=MV3k\_1+MV3k\_3;$ $MV2k\_2=MV3k\_2+MV3k\_3;$ $MV2k\_3=MV3k\_3;$ $MVfinal\_1=MV2k\_1;$ $MVfinal\_2=MV2k\_2;$ $MVfinal\_3=MV2k\_3;$ if(the master-slave relationship of the zone 1 is cancelled)

$MV2k\_1=MV3k\_1;$ $MV2k\_2=MV3k\_2+MV3k\_1;$ $MV2k\_3=MV3k\_3+MV3k\_1;$ $MVfinal\_1=MV2k\_1;$ $MVfinal\_2=MV2k\_2;$ $MVfinal\_3=MV2k\_3;$ else if(the cancelled state is switched to set the zone 3 as the master)

$MV2k\_1=MV3k\_1-MV3k\_3;$ $MV2k\_2=MV3k\_2-MV3k\_3; MV2k\_3=MV3k\_3;$ $MVfinal\_1=MV2k\_1;$ $MVfinal\_2=MV2k\_2;$ $MVfinal\_3=MV2k\_3;$ else if(the cancelled state is shifted to set the zone 1 as the master)

$MV2k\_3=MV3k\_3-MV3k\_1;$ $MV2k\_2=MV3k\_2-MV3k\_1;$ $MV2k\_1=MV3k\_1;$ $MVfinal\_1=MV2k\_1;$ $MVfinal\_2=MV2k\_2;$ $MVfinal\_3=MV2k\_3;$ else if(the zone 1 is set as the master in place of the zone 3)

$buf=MV3k\_1;$ $MV2k\_1=MV3k\_1+MV3k\_3;$ $MV2k\_2=MV3k\_2-buf;$ $MV2k\_3=-buf;$ $MVfinal\_1=MV2k\_1;$ $MVfinal\_2=MV2k\_2;$ $MVfinal\_3=MV2k\_3;$ else if(the zone 3 is set as the master in place of the zone 1)

$buf=MV3k\_3;$ $MV2k\_3=MV3k\_3+MV3k\_1;$ $MV2k\_2=MV3k\_2-buf;$ $MV2k\_1=-buf;$ $MVfinal\_1=MV2k\_1;$ $MVfinal\_2=MV2k\_2;$ $MVfinal\_3=MV2k\_3;$ else (when there is no switching)

$MVfinal\_1=MV1k\_1+MV2k\_1;$ $MVfinal\_2=MV1k\_2+MV2k\_2;$ $MVfinal\_3=MV1k\_3+MV2k\_3;$ end 3. Operations in Embodiment(s)

Next, a specific process of the first exemplary embodiment will be described with reference to a flow chart shown in FIG. 5. In the following description, the zone 3 is defined as the master loop ML.

Firstly, the supervisor 37 checks the temperature setpoint of the setpoint setting section 35 of the zone 2B and the temperature setpoint of the setpoint setting section 36 of the zone 2A (Step S1) and judges whether the temperature setpoints are changed or not (Step S2).

When the temperature setpoints are unchanged, the supervisor 37 maintains the previous state (Step S11).

When the temperature setpoints are changed, the supervisor 37 checks the changed temperature setpoints (Step S3).

Next, the supervisor 37 checks the changing pattern of each of the temperature setpoints (Step S4).

When the changing pattern of the temperature setpoints of the zones is such that uniform temperature setpoints are changed to uniform temperature setpoints, the supervisor 37 maintains the setting of the zone 3 as the master loop without changing the setting (Step S5).

When the changing pattern of the temperature setpoints of the zones is such that uniform temperature setpoints are changed to gradient temperature setpoints or gradient temperature setpoints are changed to uniform temperature setpoints, the supervisor 37 determines whether to perform a heating control or a cooling control (Step S6).

In the heating control, the supervisor 37 sets the zone having the lowest temperature setpoint as the master loop ML (Step S7). On the other hand, in the cooling control, the supervisor 37 sets the zone having the highest temperature setpoint as the master loop ML (Step S8).

When the changing pattern of the temperature setpoints of the zones is such that a first gradient pattern of temperature setpoints is changed to a second gradient pattern of temperature setpoints, the supervisor 37 determines whether the first gradient pattern is inverted to provide the second gradient pattern (Step S9).

When the first gradient pattern is inverted, the supervisor 37 cancels the setting of the master-slave relationship (Step S10).

On the other hand, when the first gradient pattern is non-inverted, the supervisor 37 maintains the previous state (Step S11).

When finishing the above determination and setting the master-slave relationship, the supervisor 37 outputs a command according to the setting to the control processor 32 (Step S12).

Subsequently, the supervisor 37 outputs a command of switching the transformation matrix to the manipulated variable converter 33 (Step S13).

Lastly, the supervisor 37 calculates the internal temperature setpoints for the respective zones and outputs the internal temperature setpoints to the error calculator 31 and the control processors 32M, 32S (Step S14).

The error calculator 31 of each of the zones calculates an error based on the internal temperature setpoint outputted from the supervisor 37 (Step S15). The control processor 32 calculates the P term, I term and D term in the PID control (Step S16).

The control processor 32 of each of the zones executes the switching or cancellation processing between the master loop and the slave loop based on the command outputted from the supervisor 37 (Step S17).

The control processor 32 of each of the zones calculates the manipulated variable to output to the manipulated variable converter 33 (Step S18).

The manipulated variable converter 33 switches the transformation matrix based on the command of switching the transformation matrix outputted from the supervisor 37 (Step S19).

Figure 6:
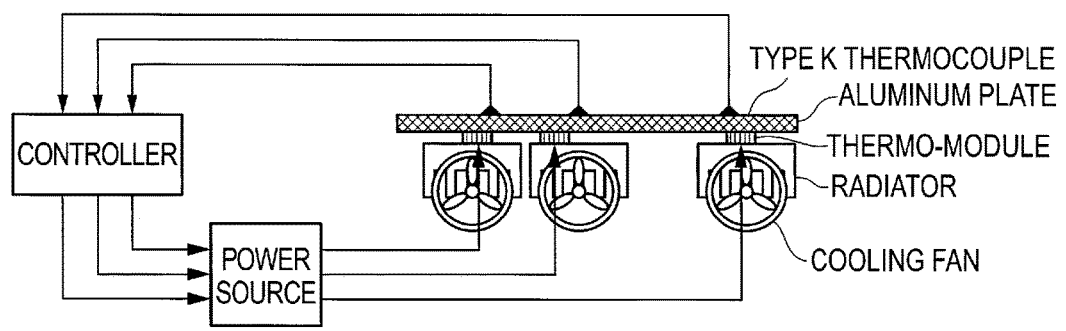
FIG. 6 is a schematic diagram showing a control system used for simulation for checking effects in the exemplary embodiment.
Figure 7:
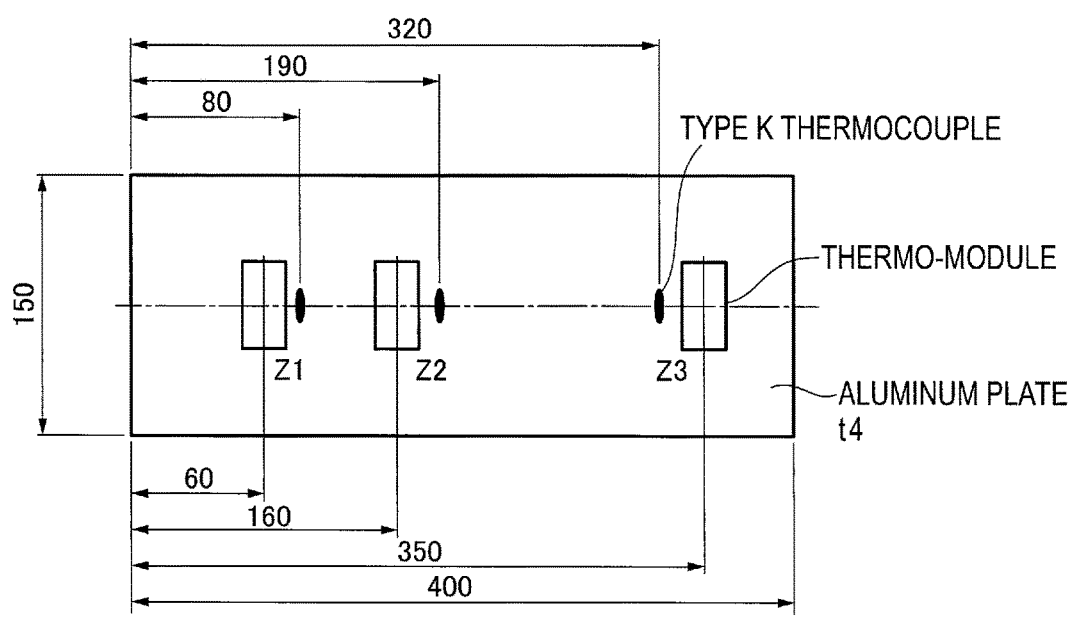
FIG. 7 is a plan view showing the control system used for simulation for checking effects in the exemplary embodiment.

4. Check of Effects of Invention by Simulation 4-1. Structure of Control System in Simulation The master-slave control of a three-input three-output system will be exemplarily described with a simulation result obtained by modeling a control system shown in FIG. 6. This control system is a system for controlling a temperature of an aluminum plate of 400×150×t4 as shown in FIG. 7 and uses an actuator in a form of three thermo-modules configured to heat and cool the plate. The temperature of the aluminum plate is measured by three type K thermocouples provided near the respective modules. The thermo-module and the thermocouples are intentionally disposed asymmetrically relative to a longitudinal direction of the plate, which is shown in dimensional detail in FIG. 7. Zones 1, 2 and 3 are defined from the left in the figure. Dynamic characteristics of each of the zones are shown in Table 1. For a simple description, the gain for the cooling control is defined as ⅓ as the gain for the heating control while the time constant and the dead time in the cooling control are the same as those in the heating control.

Table 1

| | Heating | | | | Cooling | | |
|---|---|---|---|---|---|---|---|
| | | Output | | | | Output | |
| Input | 1 | 2 | 3 | Input | 1 | 2 | 3 |
| zone 1 | | | | zone 1 | | | |
| K: gain | 38.6 | 17.0 | 8.9 | K: gain | 15.9 | 6.5 | 3.1 |
| T: time constant | 102 | 214 | 321 | T: time constant | 98 | 171 | 236 |
| L: dead time | 2 | 31 | 100 | L: dead time | 2 | 34 | 109 |
| zone 2 | | | | zone 2 | | | |
| K | 18.4 | 29.2 | 12.9 | K | 5.9 | 10.4 | 3.2 |
| T | 192 | 101 | 244 | T | 138 | 89 | 170 |
| L | 9 | 2 | 42 | L | 11 | 2 | 47 |
| zone 3 | | | | zone 3 | | | |
| K | 6.3 | 11.7 | 31.4 | K | 1.7 | 4.1 | 13.1 |
| T | 318 | 239 | 119 | T | 215 | 182 | 105 |
| L | 110 | 47 | 2 | L | 121 | 50 | 2 |

4-2. Problems in Typical Master-Slave Control

Figure 8:
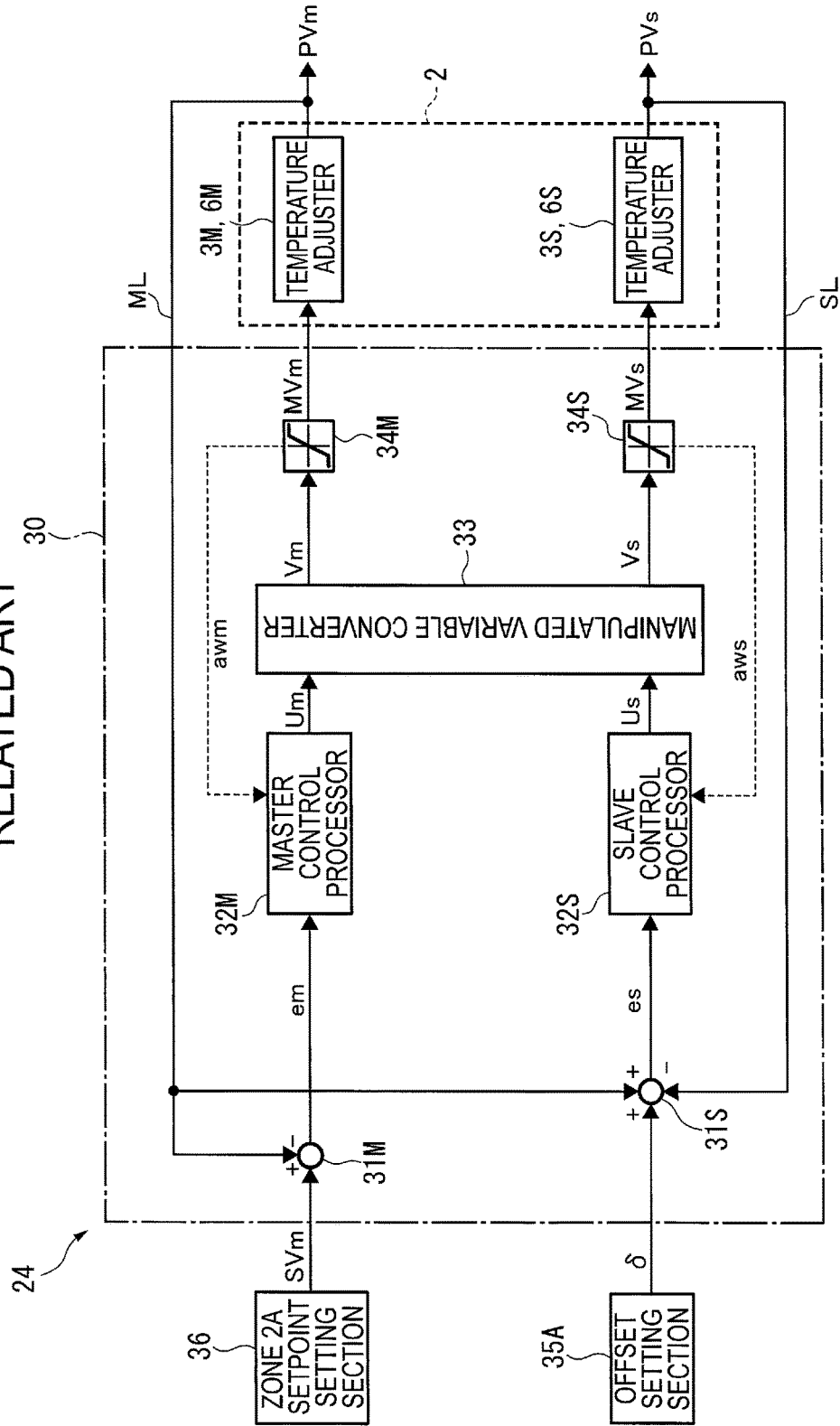
FIG. 8 is a block diagram showing a configuration of a typical master-slave control.

A controller capable of realizing a typical master-slave control sets a control loop having the slowest response as the master loop ML while setting the other control loop(s) as the slave loop SL and controls the slave loop SL to follow the master loop, as shown in FIG. 8.

This is because the control loop having the slowest response cannot follow the other control loop(s) when all the temperature setpoints are set uniform.

In heating and cooling by a plate with use of the above control, the temperature of the plate is not always uniform, but, depending on a usage, the temperature setpoints of the respective zones are sometimes made different to give the plate a temperature gradient.

In this configuration, it is only necessary to provide a suitable offset temperature to the setpoint of the slave loop. However, when a fixed master loop ML is used as in a typical master-slave control, the following problems are caused.

First Problem

Figure 9A:
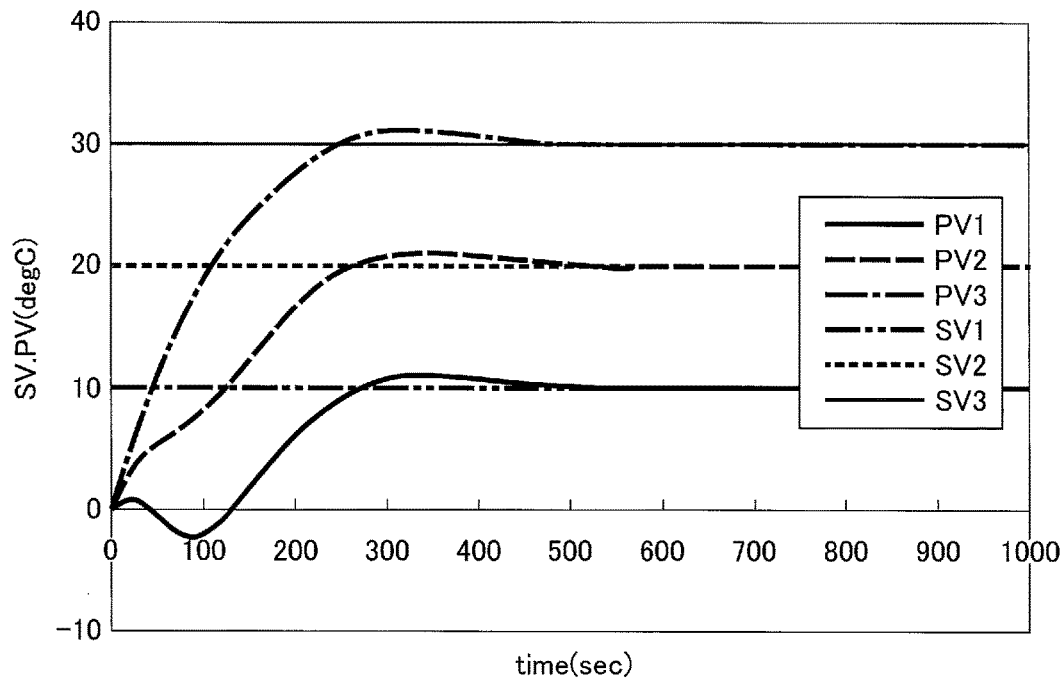
FIG. 9A is a graph showing results of simulation with respect to typical problems.

FIG. 9A shows results of the setpoint response by simulation when the temperature setpoints of the respective zones are set starting from 0 degree C. to:

$(SV1, SV2, SV3) = (10° C., 20° C., 30° C.)$.

Figure 9B:
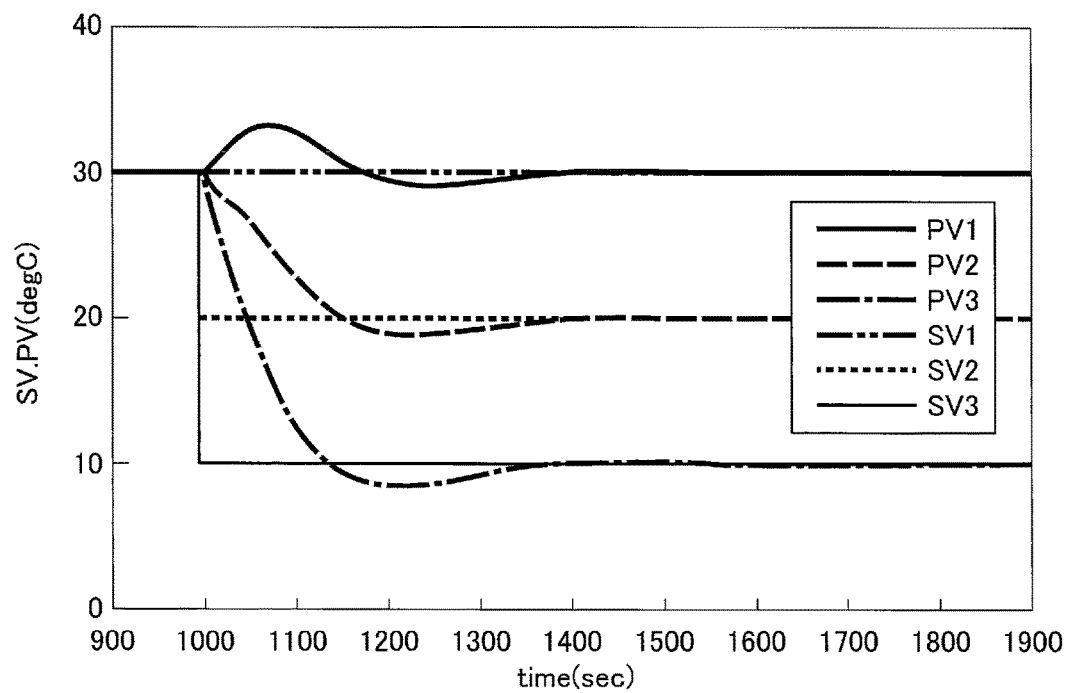
FIG. 9B is another graph showing results of simulation with respect to typical problems.

FIG. 9B shows results of the setpoint response by simulation when the temperature setpoints of the respective zones are set starting from 30 degrees C. to:

$(SV1, SV2, SV3) = (30° C., 20° C., 10° C.)$.

In both of the above responses, the zone 1 demonstrates an inverse response at the start of the heating (cooling), which causes a dead time for a rise time. This is because the zone having the highest (lowest) temperature setpoint is set as the master loop ML in heating (cooling). For instance, when the master loop ML starts being executed for heating, the slave loop SL is affected to be temporarily executed for cooling against the master loop ML, since the slave loop SL is supposed to offset the master loop ML. Since the master loop ML usually demonstrates a slower response than the slave loop SL, such a phenomenon becomes further noticeable.

Second Problem

Figure 10:
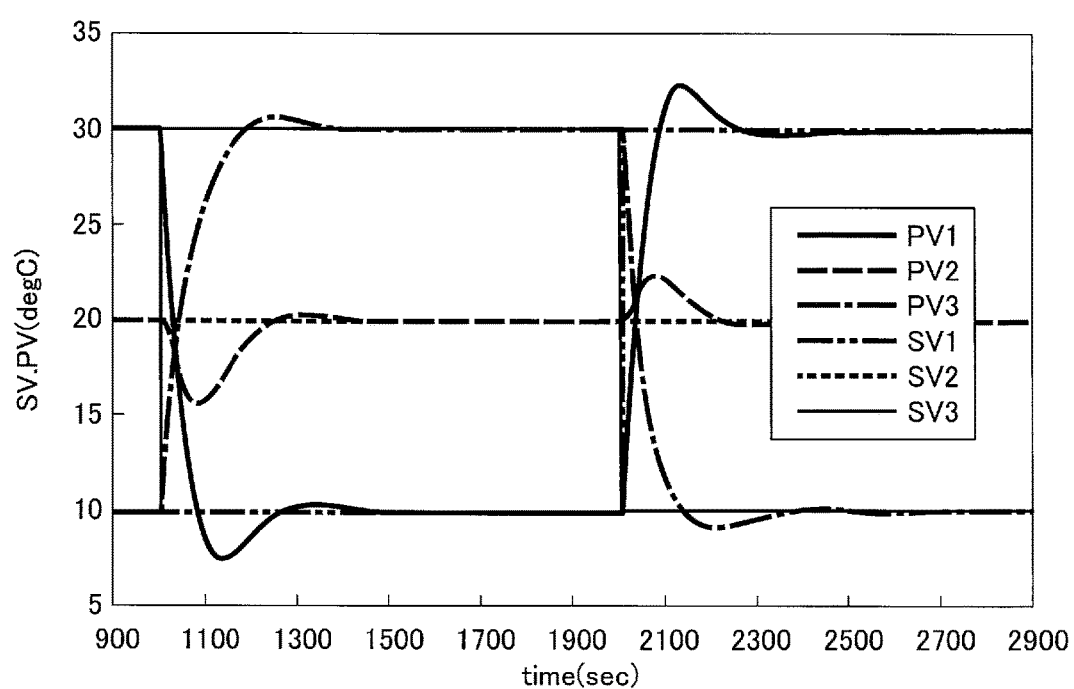
FIG. 10 is still another graph showing results of simulation with respect to typical problems.

FIG. 10 demonstrates a response occurring when the temperature setpoints of the respective zones are in a steady state at (SV1, SV2, SV3)=(30° C., 20° C., 10° C.), switched to (SV1, SV2, SV3)=(10° C., 20° C., 30° C.) after the elapse of 1000 seconds, and further switched to (SV1, SV2, SV3)= (30° C., 20° C., 10° C.) after the elapse of 2000 seconds.

The master loop ML is the zone 3. Although the temperature setpoint of the zone 2 is constantly 20 degrees C., a large fluctuation of the temperature setpoint occurs every time to switch the temperature setpoints.

This is attributed to a temperature setting process of the master and slave loops. As described above, in the temperature setpoint setting for the master and slave loops, the master loop is set at its own temperature setpoint but the slave loop is set at an offset value against the master loop.

For instance, when the master loop ML is the zone 3 and the temperature setpoints of the respective zones are set at (SV1, SV2, SV3)=(30° C., 20° C., 10° C.), the internal temperature setpoint of the zone 3 as the master loop is 10° C., but the internal temperature setpoint of the zone 2 as the slave loop is +10° C. since an offset value against the internal temperature setpoint of the zone 3 becomes +10° C., and similarly the internal temperature setpoint of the zone 1 is +20° C. since an offset value against the internal temperature setpoint of the zone 3 becomes +20° C.

At this time, when the temperature setpoints are switched to (SV1, SV2, SV3)=(10° C., 20° C., 30° C.), the internal temperature setpoint of the zone 3 is 30° C. Considering in the same way as described above, the internal temperature setpoint of the zone 2 becomes −10° C. and the internal temperature setpoint of the zone 1 becomes −20° C.

Accordingly, the internal temperature setpoint of the zone 2 is switched from +10° C. to −10° C. although the temperature setpoint of the zone 2 remains 20° C. before and after switching the temperature setpoints. In other words, at the moment of switching the temperature setpoints, an error of +10−(−10)=20° C. occurs to affect a controlled target as the manipulated variable.

As described above, in a typical master-slave control, the above problems are caused by fixing the master loop and the slave loop, resulting in deterioration of throughput in an actual process.

In order to solve the first problem, the zone having the lowest temperature setpoint is determined as the master loop ML in the heating control, while the zone having the highest temperature setpoint is determined as the master loop ML in the cooling control.

For instance, in the examples described in FIGS. 9A and 9B, the zone 1 having the lowest temperature setpoint is set as the master loop ML in the heating control shown in FIG. 9A, while the zone 1 having the highest temperature setpoint is set as the master loop ML in the cooling control shown in FIG. 9B.

With this setting, the zone 1 is heated in a manner to boost heating of the zones 2 and 3 in the heating control, while the zone 1 is cooled in a manner to boost cooling of the zones 2 and 3 in the cooling control.

In other words, since the responses of all the zones are directed in the same direction, more stable responses can be obtained.

Figure 11A:
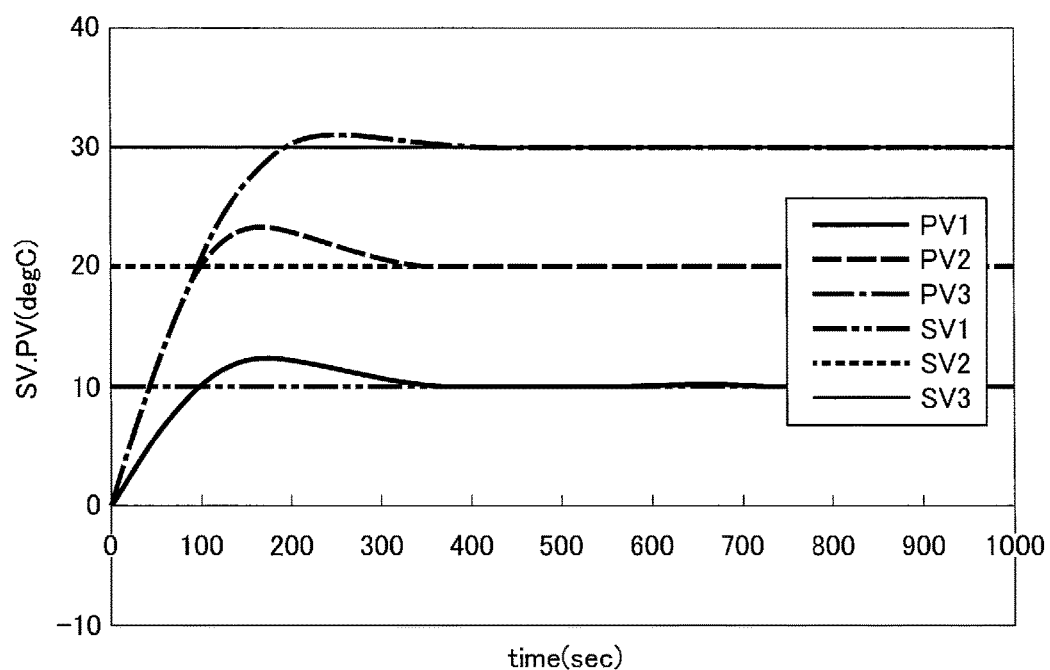
FIG. 11A is a graph showing simulation results in the exemplary embodiment.
Figure 11B:
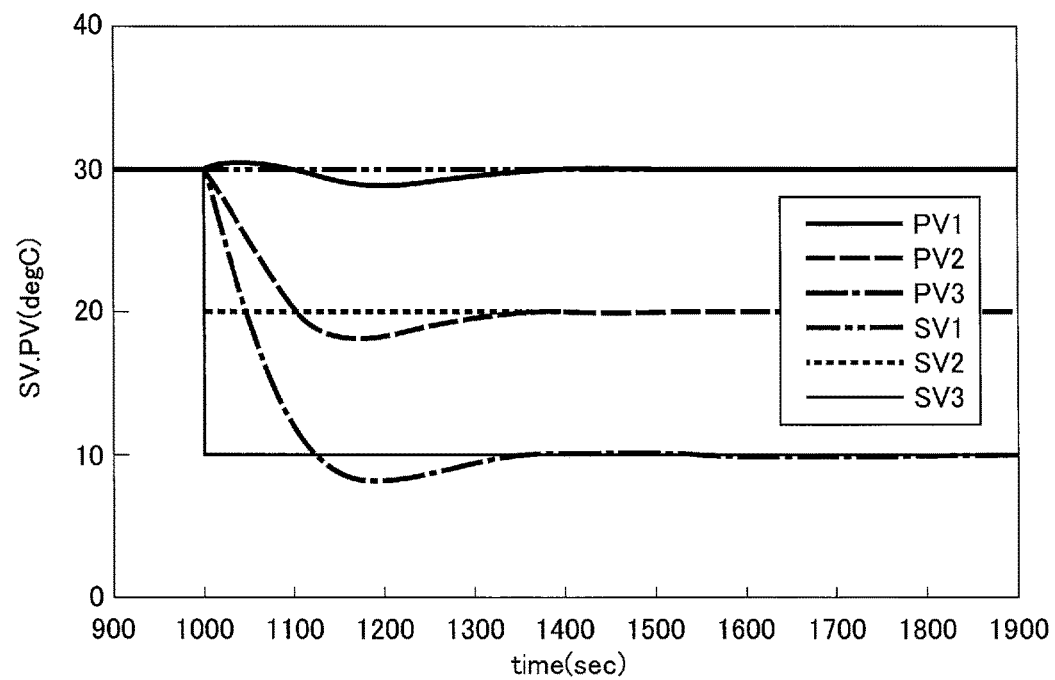
FIG. 11B is another graph showing simulation results in the exemplary embodiment.

FIGS. 11A and 11B show results obtained when the zone 1 is set as the master loop ML under the same conditions as in FIGS. 9A and 9B. It is recognized that the results show more stable responses than those obtained when the zone 3 is set as the master loop ML.

A solution of the second problem is to cancel the master-slave relationship when the gradient temperature setting is changed to an inverse gradient temperature setting.

By cancelling the master-slave relationship, the temperature setpoint coincides with the temperature setpoint to reduce a drastic change in the error generated when inverting the gradient temperature, so that an influence on the response is decreased.

Figure 12:
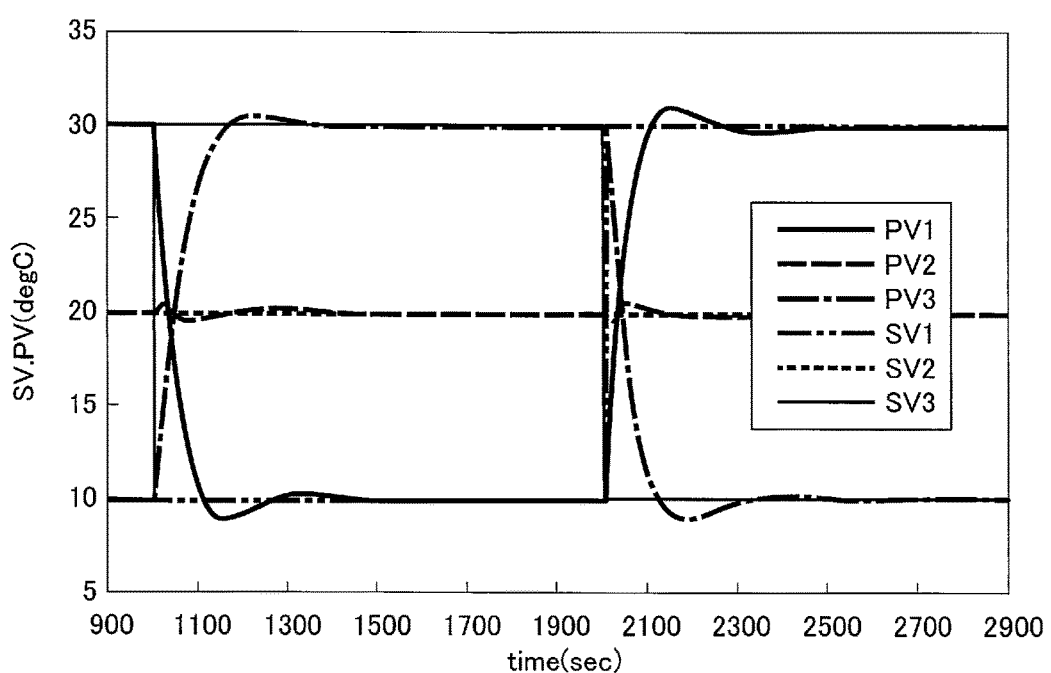
FIG. 12 is still another graph showing simulation results in the exemplary embodiment.

FIG. 12 shows results obtained when the master-slave relationship is cancelled under the same conditions as in FIG. 10. It is recognized that overshoot and undershoot of the zone 2 are significantly reduced.

Since an inverse response and a fluctuated response in the setpoint response are reduced by the aforementioned process as described above, it was confirmed by simulation that throughput is improved in an actual process.

What is claimed is:

1. A temperature controller for a semiconductor wafer, the temperature controller configured to perform a temperature control of a plurality of temperature adjusters comprising a reference temperature adjuster to perform a temperature adjustment of the semiconductor wafer, the temperature controller comprising:
    a master loop configured to perform a temperature control of the reference temperature adjuster;
    a slave loop configured to perform a temperature control of the temperature adjuster(s) other than the reference temperature adjuster to follow the master loop;
    a master temperature detector configured to detect a temperature of the semiconductor wafer subjected to the temperature adjustment by the reference temperature adjuster of the master loop;
    a slave temperature detector configured to detect the temperature of the semiconductor wafer subjected to the temperature adjustment by the temperature adjuster(s) of the slave loop; and
    a manipulated variable calculator configured to calculate a manipulated variable to be given to the reference temperature adjuster of the master loop and a manipulated variable to be given to the temperature adjuster(s) of the slave loop, based on the temperature detected by the master temperature detector and the temperature detected by the slave temperature detector,
    the manipulated variable calculator comprising:
    a master-slave switching unit configured to switch between the master loop and the slave loop according to setting conditions of a temperature setpoint of the master loop and a temperature setpoint of the slave loop before and after being changed; and
    a master-slave cancellation unit configured to cancel a setting of the master loop and the slave loop based on the temperature setpoint of the slave loop being set to be different from the temperature setpoint of the master loop by adding a temperature gradient to the temperature setpoint of the master loop.

2. The temperature controller for the semiconductor wafer according to claim 1, wherein the master-slave switching unit is configured to switch the master loop to a loop having a lowest temperature setpoint in a heating control and to a loop having a highest temperature setpoint in a cooling control.

3. The temperature controller for the semiconductor wafer according to claim 1, wherein
    the slave loop comprises two or more slave loops, and the temperature gradient with three or more different temperature setpoints is set between the master loop and the two or more slave loops, and
    the master-slave cancellation unit cancels the setting of the master loop based on the temperature gradient set with the three or more different temperature setpoints being inverted during the temperature control.

4. The temperature controller for the semiconductor wafer according to claim 2, wherein
    the slave loop comprises two or more slave loops, and the temperature gradient with three or more different temperature setpoints is set between the master loop and the two or more slave loops, and
    the master-slave cancellation unit cancels the setting of the master loop based on the temperature gradient set with the three or more different temperature setpoints being inverted during the temperature control.

* * * * *